US009247675B2

(12) United States Patent
Higuchi et al.

(10) Patent No.: US 9,247,675 B2
(45) Date of Patent: Jan. 26, 2016

(54) POWER CONVERTER

(75) Inventors: Katsuhiro Higuchi, Hitachinaka (JP); Akira Ishii, Hitachinaka (JP); Hidenori Shinohara, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 175 days.

(21) Appl. No.: 14/126,966

(22) PCT Filed: Jul. 9, 2012

(86) PCT No.: PCT/JP2012/067516
§ 371 (c)(1),
(2), (4) Date: Dec. 17, 2013

(87) PCT Pub. No.: WO2013/015106
PCT Pub. Date: Jan. 31, 2013

(65) Prior Publication Data
US 2014/0126154 A1 May 8, 2014

(30) Foreign Application Priority Data

Jul. 27, 2011 (JP) ................................. 2011-164055

(51) Int. Cl.
*H05K 7/20* (2006.01)
*H02M 3/00* (2006.01)
(Continued)

(52) U.S. Cl.
CPC .............. *H05K 7/2039* (2013.01); *B60L 3/003* (2013.01); *B60L 3/04* (2013.01); *B60L 11/1803* (2013.01);
(Continued)

(58) Field of Classification Search
CPC .............. H05K 7/2039; H05K 7/1432; H05K 7/20927; B60L 11/1868; B60L 11/1803; B60L 15/20; B60L 3/003; B60L 15/007; B60L 3/04; B60L 2270/145; B60L 2240/423; B60L 2240/36; B60L 2240/525; B60L 2210/12; B60L 2210/40; B60L 2210/14; H02M 3/00; H02M 7/003; Y02T 10/7275; Y02T 10/7225; Y02T 10/642; Y02T 10/7066; Y02T 10/7005; Y02T 10/7241; Y02T 10/7233
USPC ............... 361/600–678; 165/80.1, 80.2, 80.4, 165/80.5, 104.33; 180/65.1, 65.21; 363/17, 363/97, 131, 141
See application file for complete search history.

(56) References Cited

U.S. PATENT DOCUMENTS

2008/0130223 A1* 6/2008 Nakamura ............ H02M 7/003
361/689
2008/0198548 A1* 8/2008 Nakamura ......... H05K 7/20927
361/689
(Continued)

FOREIGN PATENT DOCUMENTS

JP 4300717 B2 5/2009
JP 2009-219270 A 9/2009
(Continued)

OTHER PUBLICATIONS

International Search Report (PCT/ISA/210) with English translation dated Oct. 16, 2012 (Three (3) pages).

*Primary Examiner* — Anthony Haughton
*Assistant Examiner* — Yahya Ahmad
(74) *Attorney, Agent, or Firm* — Crowell & Moring LLP

(57) ABSTRACT

A power converter includes an inverter in an inverter case, and a DC/DC converter in a converter case detachably fixed to the inverter case. The inverter includes power semiconductor modules, and the DC/DC converter includes a down-converter circuit and/or a boost converter circuit. The inverter case includes first and second path-forming members thermally contacting the converter case. In the first path-forming member, the power semiconductor module is inserted into a first coolant path. In the second path-forming member, the power semiconductor module inserted into the second coolant path, which is parallel to the first coolant path. The DC/DC converter includes an inductance device, and a switching device board on which a switching device con rolling electric current in the inductance device is mounted. The inductance and switching devices are in an area of the converter case thermally contacting first and second path forming members.

8 Claims, 14 Drawing Sheets

(51) Int. Cl.
*B60L 3/00* (2006.01)
*B60L 3/04* (2006.01)
*B60L 15/00* (2006.01)
*B60L 11/18* (2006.01)
*B60L 15/20* (2006.01)
*H05K 7/14* (2006.01)
*H02M 7/00* (2006.01)

(52) U.S. Cl.
CPC ........... B60L 11/1868 (2013.01); B60L 15/007 (2013.01); B60L 15/20 (2013.01); H02M 3/00 (2013.01); H05K 7/1432 (2013.01); H05K 7/20927 (2013.01); *B60L 2210/12* (2013.01); *B60L 2210/14* (2013.01); *B60L 2210/40* (2013.01); *B60L 2240/36* (2013.01); *B60L 2240/423* (2013.01); *B60L 2240/525* (2013.01); *B60L 2270/145* (2013.01); *H02M 7/003* (2013.01); *Y02T 10/642* (2013.01); *Y02T 10/7005* (2013.01); *Y02T 10/7066* (2013.01); *Y02T 10/7225* (2013.01); *Y02T 10/7233* (2013.01); *Y02T 10/7241* (2013.01); *Y02T 10/7275* (2013.01)

(56) References Cited

U.S. PATENT DOCUMENTS

| | | | |
|---|---|---|---|
| 2009/0040724 A1* | 2/2009 | Nishikimi | H02M 7/003 361/699 |
| 2009/0231811 A1* | 9/2009 | Tokuyama | H01L 23/36 361/699 |
| 2010/0025126 A1* | 2/2010 | Nakatsu | B60L 11/00 180/65.1 |
| 2011/0051371 A1* | 3/2011 | Azuma | B60K 6/445 361/699 |
| 2013/0265808 A1* | 10/2013 | Ishii | H02M 7/003 363/97 |
| 2013/0279114 A1* | 10/2013 | Nishikimi | B60K 6/28 361/699 |
| 2014/0240946 A1* | 8/2014 | Fukumasu | B60L 11/1816 361/811 |
| 2014/0285970 A1* | 9/2014 | Shinohara | H02M 7/003 361/689 |
| 2014/0313806 A1* | 10/2014 | Shinohara | H05K 7/20927 363/141 |
| 2015/0163962 A1* | 6/2015 | Suzuki | H02M 7/003 361/699 |
| 2015/0194898 A1* | 7/2015 | Shinohara | H05K 9/0037 363/17 |

FOREIGN PATENT DOCUMENTS

| | | |
|---|---|---|
| JP | 2011-29480 A | 2/2011 |
| JP | 2013-94022 A | 5/2013 |
| JP | 2013-94023 A | 5/2013 |
| JP | 2013-99044 A | 5/2013 |
| JP | 2013-99053 A | 5/2013 |

* cited by examiner

FIG. 13
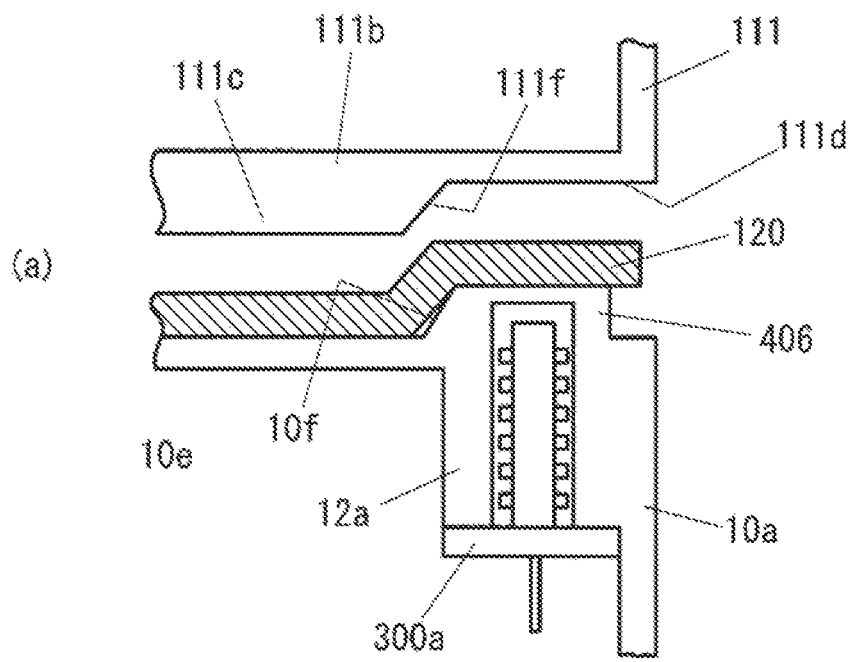
(a)
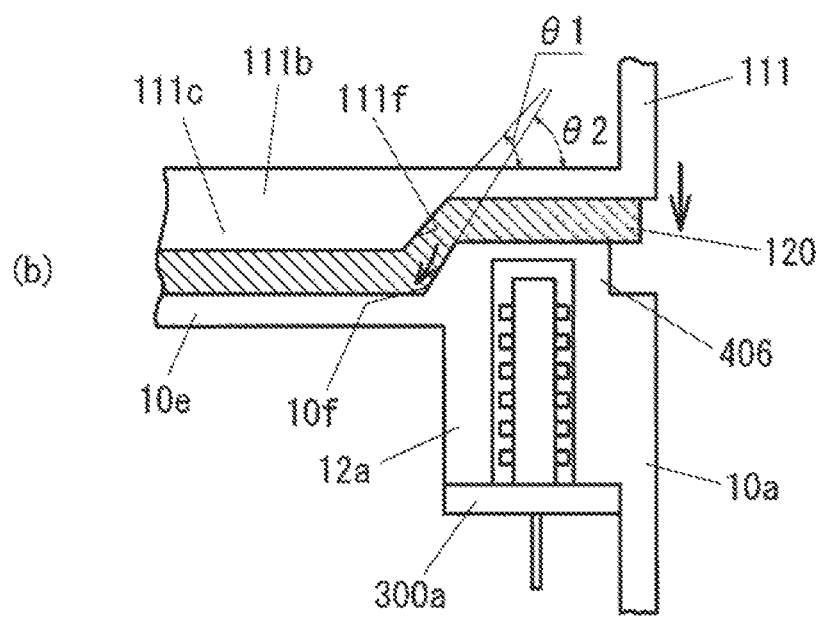
(b)

POWER CONVERTER

TECHNICAL FIELD

The present invention relates to a power converter in which a DC/DC converter and an inverter are detachably integrated.

BACKGROUND ART

An electric vehicle or a plug-in hybrid electric vehicle is equipped with an inverter and a low voltage battery. The inverter is used to drive a motor with a high voltage battery for power-driving, and the low voltage battery is used to actuate auxiliary machines such as a vehicle light and a radio. This type of vehicle is equipped with a DC/DC converter which converts the power from the high voltage battery to the low voltage battery, or from the low voltage battery to the high voltage battery (see PTL 1, for example).

In such a vehicle, it is desired to improve the inhabitability by maximizing the proportion of interior room space to an entire vehicle volume. Therefore, it is desired that the inverter and the DC/DC converter be mounted in a minimum space outside the vehicle room, especially in an engine room.

CITATION LIST

Patent Literature

PTL 1: Publication of Japanese Patent No. 4300717

SUMMARY OF INVENTION

Technical Problem

Incidentally, the temperature environment inside the engine room is higher than the prior use environment. Particularly, using the inverter and the DC/DC converter in the high temperature range may accelerate degradation of control functions and deterioration of the components thereof. For this reason, a cooling mechanism using a coolant, which generally contains water and a mixture, is applied to cool the inverter and the DC/DC converter. In such a cooling mechanism including the cooling method, high cooling efficiency and space-saving are important technical elements.

However, the cooling mechanism needs to include cooling pipes for the inverter and the DC/DC converter respectively. Therefore, there are problems in that cooling paths are complicated and the in-vehicle space is increased.

Solution to Problem

According to an embodiment of the present invention, a power converter includes an inverter housed in an inverter case, and a DC/DC converter housed in a converter case detachably fixed to the inverter case. The inverter is provided with a plurality of power semiconductor modules configured to output alternate current, and the DC/DC converter is provided with a down converter circuit and/or a boost converter circuit. The inverter case includes a first path forming member thermally contacting the converter case, and a second path forming member thermally contacting the converter case. In the first path forming member, a first coolant path is formed and the power semiconductor module is inserted into the first coolant path. In the second path forming member, a second coolant path is formed in parallel to the first coolant path, and the power semiconductor module is inserted into the second coolant path inc DC/DC converter includes an inductance device for voltage conversion, and a switching device board on which a switching device configured to control the electric current flowing in the inductance device is mounted. The inductance device and the switching device board are arranged in an area of the converter case thermally contacting the first path forming member and the second path forming member.

Advantageous Effects of Invention

The present invention can provide a power converter in which degradation of the functions and deterioration of the components due to the high temperature environment may be prevented, and also enlargement of the device is suppressed.

BRIEF DESCRIPTION OF DRAWINGS

FIG. 5 is a perspective view illustrating an external appearance of a power semiconductor module 300a.

FIG. 6 is a cross-sectional view of the power semiconductor module 300a.

FIG. 13 is a view illustrating inclined side surfaces 111$f$ and 10$f$.

DESCRIPTION OF EMBODIMENTS

Figure 1:
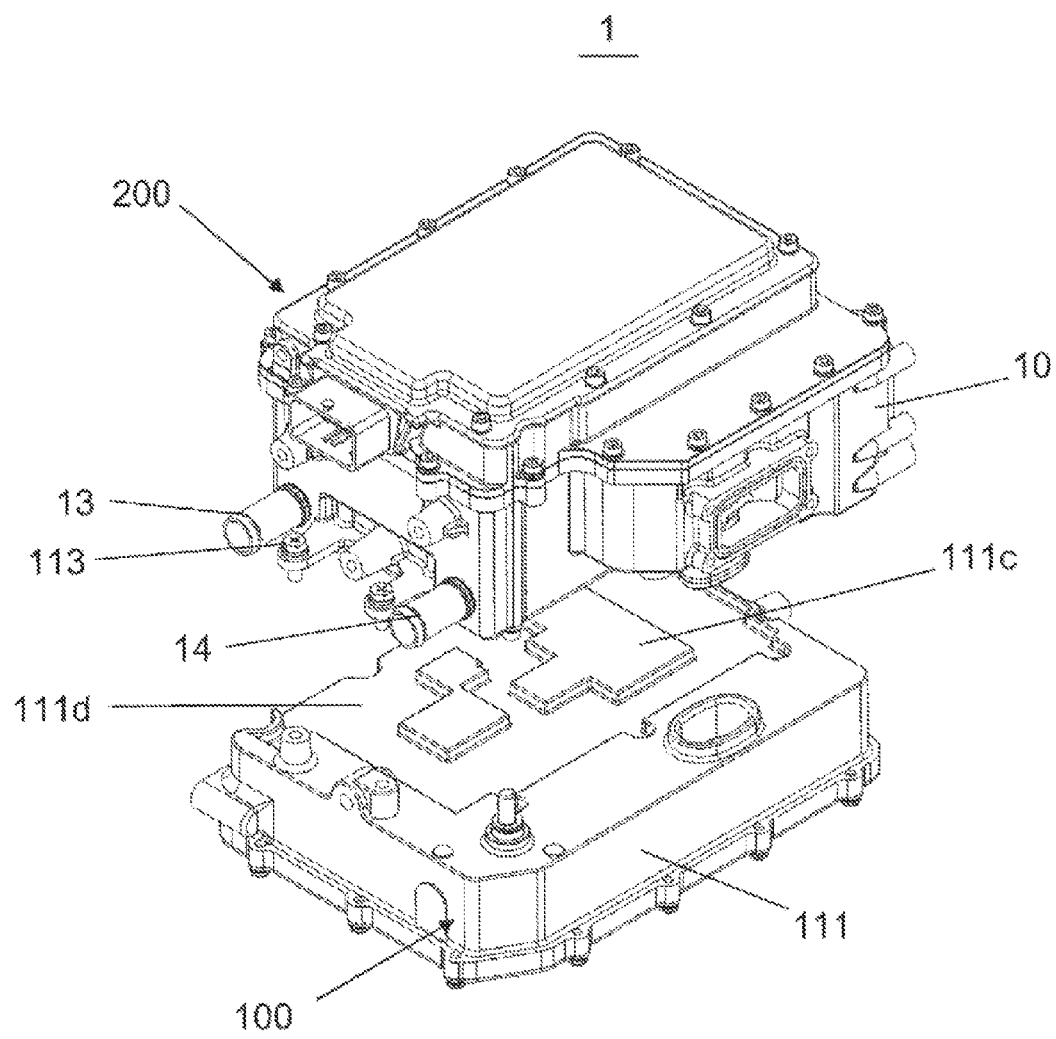
FIG. 1 is an external perspective view for describing a power converter 1.
Figure 2:
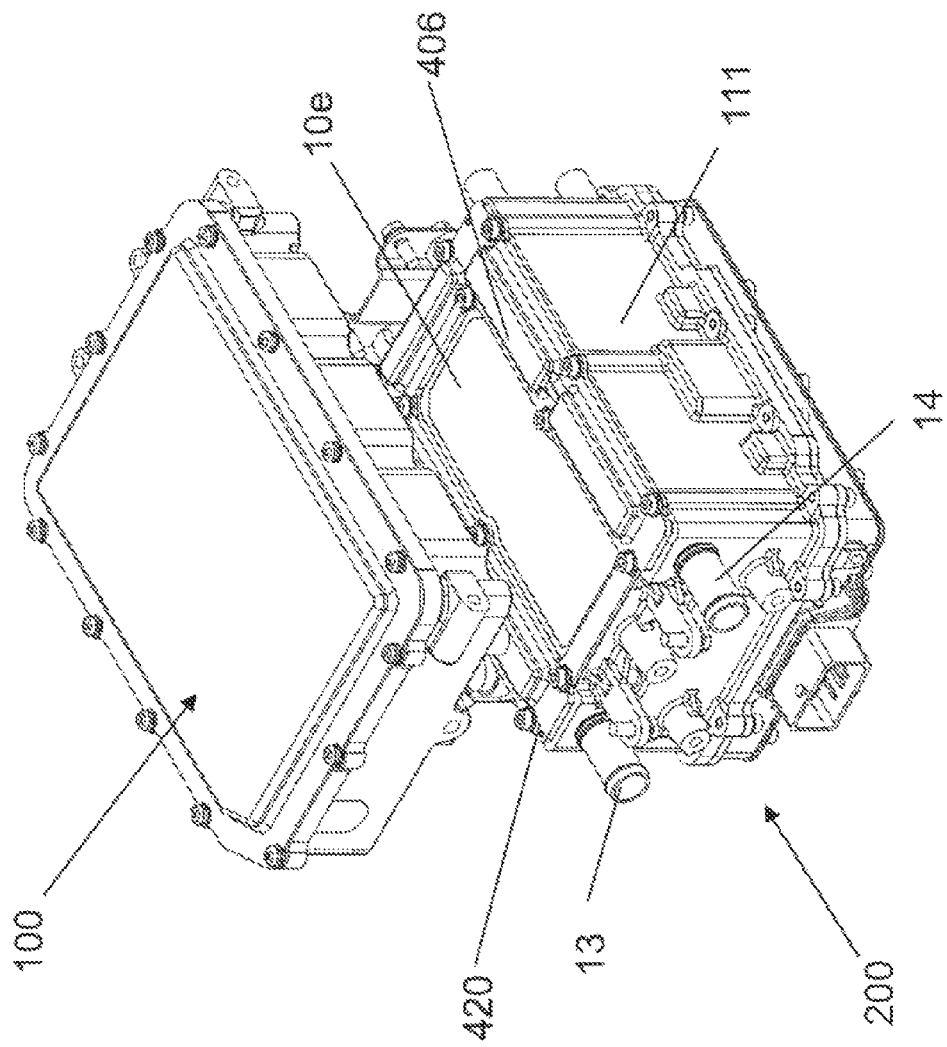
FIG. 2 is another external perspective view for describing the power converter 1.

An embodiment for implementing the present invention is described hereinafter with reference to the drawings. FIGS. 1 and 2 are external perspective views of a power converter 1. FIG. 2 is the view of the power converter of FIG. 1 turned vertically upside down. The power converter 1 is formed by integrating a DC/DC converter 100 with an inverter 200. In FIGS. 1 and 2, the DC/DC converter 100 and the inverter 200 are separated. The DC/DC converter 100 is fixed to a bottom face side of a case of the inverter 200 with a plurality of bolts 113.

This power converter 1 is applied, for example, to an electric vehicle, and the inverter 200 is configured to drive a driving motor by the power from an in-vehicle high voltage battery. The vehicle is equipped with a low voltage battery to actuate the auxiliary machines, such as a light and a radio. The DC/DC converter 100 converts the power from the high voltage battery to the low voltage battery, or from the low voltage battery to the high voltage battery.

As will be described later, coolant paths are formed inside sidewalls of a case 10 of the inverter 200, and coolant flows through the coolant paths. The coolant flows into the coolant path from an inlet pipe 13 and flows out from an outlet pipe 14. At lower edges of the sidewalls where the coolant paths are formed, a bottom cover 420 is fixed in order to close openings of the coolant paths. In other words, the coolant paths are formed below the bottom cover 420 in FIG. 2. With this configuration, the bottom cover 420 is projected from the bottom face side of the case 10 in a substantially U-shape, and a depressed portion is formed in a center part of the bottom face portion. On the other hand, a case 111 of the DC/DC converter 100 includes a depressed portion 111d formed on a surface facing the inverter 200. The inverter 200 is fixed to the DC/DC converter 100 such that the bottom face portion of the case 10 is fitted into this depressed portion 111d.

Figure 3:
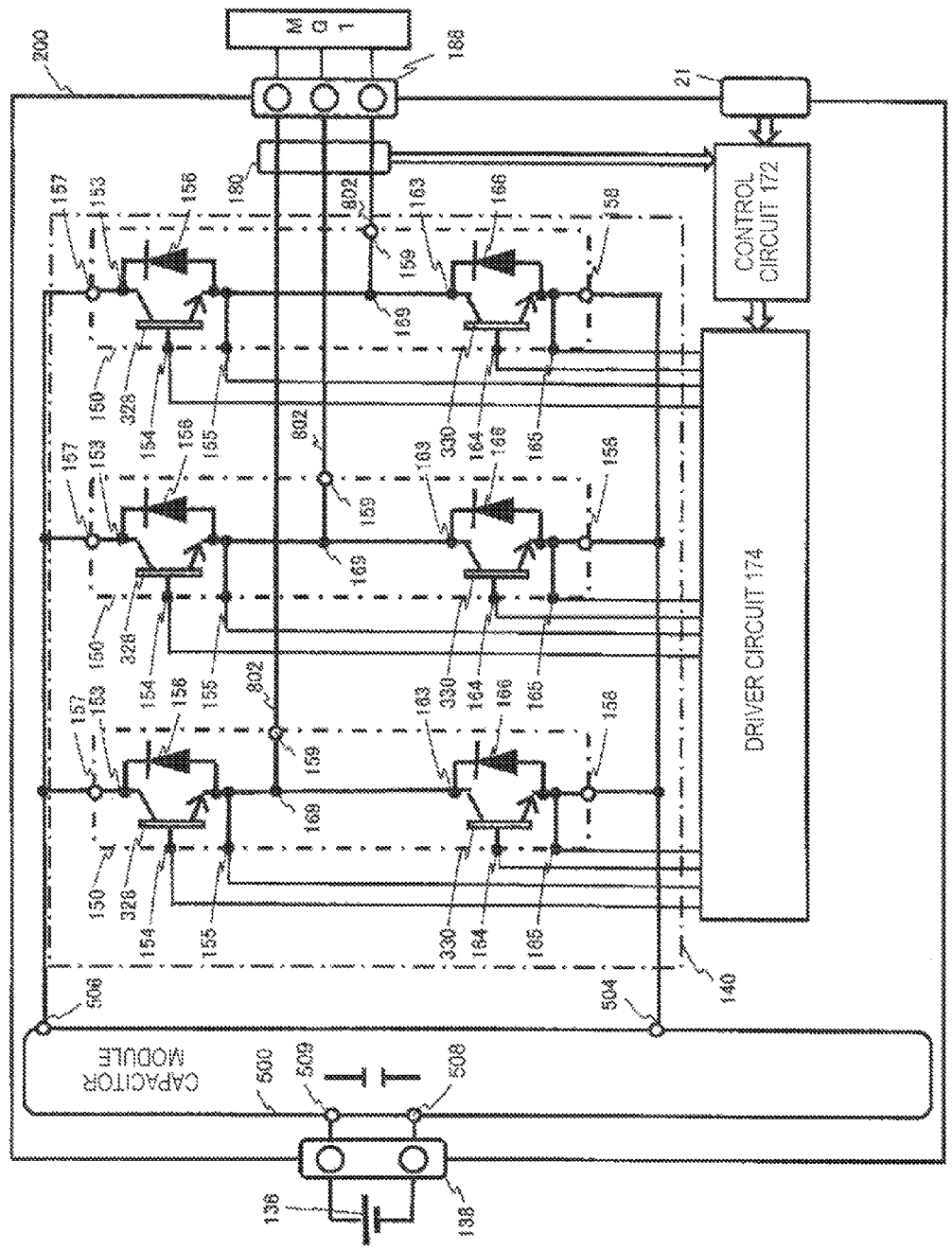
FIG. 3 is a circuit block diagram illustrating a configuration of an inverter 200.

FIG. 3 is a circuit block diagram illustrating a configuration of the inverter 200. Note that In FIG. 3, an insulated gate bipolar transistor is used as a semiconductor device and will be hereinafter abbreviated as IGBT. A series circuit 150 includes an upper arm and a lower arm. An IGBT 328 and a diode 156 work as the upper arm, and an IGBT 330 and a diode 166 work as the lower arm. The inverter circuit 140 includes three sets of this series circuit 150 for corresponding three phases, i.e., U-phase, V-phase, and W-phase, from which AC power is to be output.

In this embodiment, these three phases correspond to respective three-phase windings of an armature winding of a motor generator MG1 which corresponds to the driving motor. Each of the three-phased series circuits 150 including the upper/lower arms outputs the alternate current from an intermediate electrode 169 positioned at a midpoint of the series circuit. This intermediate electrode 169 is connected, via an AC terminal 159 and an AC terminal 188, to an AC bus bar 802 which is an AC power line to the motor generator MG1.

A collector electrode 153 of the IGBT 328 at the upper arm is electrically connected to a positive-side capacitor terminal 506 of a capacitor module 500 via a positive terminal 157. Further, an emitter electrode of the IGBT 330 at the lower arm is electrically connected to a negative-side capacitor terminal 504 of the capacitor module 500 via a negative terminal 158.

A control circuit 172 receives a control command via a connector 21 from an upper control device, and generates a control pulse based on this command, and subsequently supplies the control pulse to a driver circuit 174. The control pulse is a control signal to control the IGBT 328 or the IGBT 330 that configures the upper arm or the lower arm of the series circuit 150 of each phase included in the inverter circuit 140.

Based on the above-mentioned control pulse, the driver circuit 174 supplies a drive pulse to the IGBT 328 or the IGBT 330 of each phase to control the IGBT 328 or the IGBT 330 that configures the upper arm or the lower arm of the series circuit 150 of each phase. The IGBT 328 or the IGBT 330 executes conduction or interruption based on the drive pulse received from the driver circuit 174, and then converts the DC power, supplied from a battery 136, to three-phase AC power. After that, this converted power is supplied to the motor generator MG1.

The IGBT 328 includes a collector electrode 153, an emitter electrode 155 for signals, and a gate electrode 154. Further, the IGBT 330 includes a collector electrode 163, an emitter electrode 165 for signals, and a gate electrode 164. The diode 156 is electrically connected between he collector electrode 153 and the emitter electrode 155. Further, the diode 166 is electrically connected between the collector electrode 163 and the emitter electrode 165.

A metal oxide semiconductor field effect transistor (hereinafter abbreviated as MOSFET) may be used as a power semiconductor device for switching. In this case, the diode 156 or the diode 166 is not necessary. As the power semiconductor device for switching, the IGBT is suitable in the case where DC voltage is relatively high, and the MOSFET is suitable in the case where the DC voltage is relatively low.

The capacitor module 500 include a positive-side capacitor terminal 506, a negative-side capacitor terminal 504, a positive-side power supply terminal 509, and a negative-side power supply terminal 508. The high-voltage DC power from the battery 136 is supplied, via a DC connector 138, to the positive-side power supply terminal 509, or to the negative-side power supply terminal 508, and the supplied to the inverter circuit 140 from the positive-side capacitor terminal 506 and the negative-side capacitor terminal 504 of the capacitor module 500.

On the other hand, the DC power converted from the AC power by the inverter circuit 140 is supplied to the capacitor module 500 from the positive-side capacitor terminal 506 or the negative-side capacitor terminal 504, and subsequently supplied to the battery 136 from the positive-side power supply terminal 509 or the negative-side power supply terminal 508 via the DC connector 138. Then, the DC power is stored in the battery 136.

The control circuit 172 includes a microcomputer to compute switching timings at the IGBT 328 and the IGBT 330. The information to be input to the microcomputer includes a target torque value which is requested to the motor generator MG1, a current value supplied from the series circuit 150 to the motor generator MG1, and a magnetic pole position of a rotor of the motor generator MG1.

The target torque value is based on a command signal output from the upper control device (not illustrated). The current value is detected based on a detection signal from a current sensor 180. The magnetic pole position is detected based on a detection signal output from a rotating magnetic sensor (not illustrated), such as a resolver, provided at the motor generator MG1. According to the present embodiment, the case where the current sensor 180 detects the current values of the three phases is exemplified. However, it is also possible to configure the current sensor 180 to detect the current values of two phases and obtain the current values of the three phases by computing.

The microcomputer in the control circuit 172 computes current command values of a d-axis and a q-axis of the motor generator MG1 based on the target torque value, and then computes voltage command values of the d-axis and the q-axis based on the differences between the computed current command values of the d-axis and the q-axis and the detected current values of the d-axis and the p-axis. Then, the microcomputer converts these computed voltage command values of the d-axis and the p-axis to voltage command values of the U-phase, the V-phase, and the W-phase based on the detected magnetic pole position. Subsequently, the microcomputer generates a pulse-like modulated waveform based on comparison between a fundamental wave (sinusoidal wave) and a carrier wave (triangular wave) based on the voltage command values of the U-phase, the V-phase, and the W-phase, and then outputs, to the driver circuit 174, the generated modulated waveform as a PWM (pulse-width modulation) signal.

In the case of driving the lower arm, the driver circuit 174 outputs a drive signal, obtained by amplifying the PWM signal, to the gate electrode of the IGBT 330 at the corresponding lower arm. Further, in the case of driving the upper arm, the driver circuit 174 amplifies the PUN signal after shifting a reference potential level of the PUN signal to a reference potential level of the upper arm, and then outputs the amplified PWM signal, as the drive signal, to the gate electrode of the IGBT 328 at corresponding upper arm.

Additionally, the microcomputer inside the control circuit 172 detects abnormal conditions (over-current, over-voltage, over-temperature, etc.) and protects the series circuit 150. For this reason, sensing information is input to the control circuit 172. For example, the information related to the current which flows in an emitter electrode of each of the IGBT 328 and the IGBT 330 is input to a corresponding driving portion (IC) from the emitter electrode 155 for signals and the emitter electrode 165 for signals at the respective arms. This allows each driving portion (IC) to detect over-current and to stop the switching operation at the corresponding IGBT 328 and IGBT 330 in the case of detecting any over-current. Consequently, the corresponding IGBT 328 and IGBT 330 are protected from the over-current.

The information related to the temperature of the series circuit 150 is input to the microcomputer from a temperature sensor (not illustrated) provided at the series circuit 150. Further, the information related to the voltage at the DC positive side of the series circuit 150 is input to the microcomputer. The microcomputer detects over-temperature and over-voltage based on these pieces of information, and stops the switching operation at all of the IGBTs 328 and the IGBTs 330 in the case of detecting any over-temperature or over-voltage.

Figure 4:
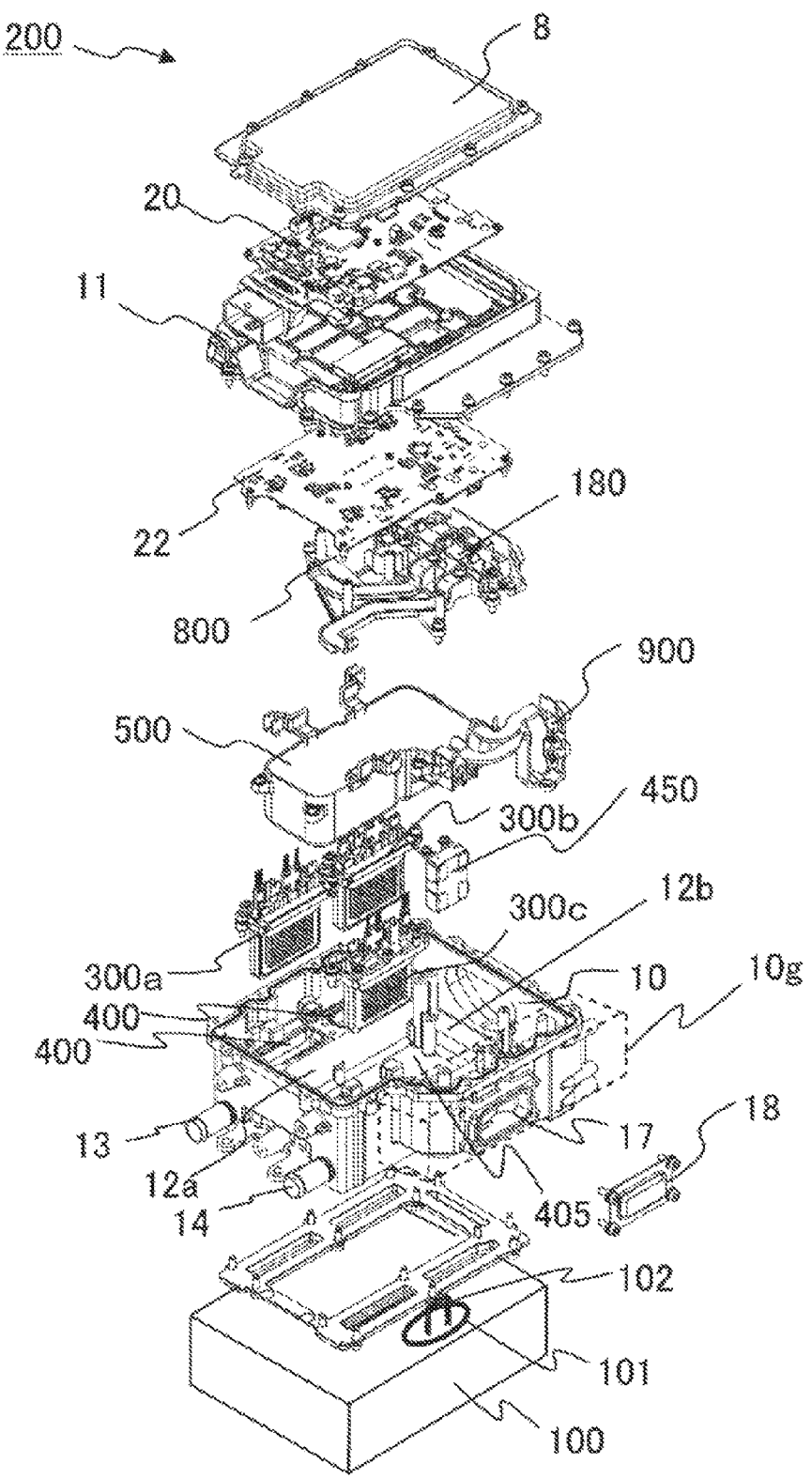
FIG. 4 is an exploded perspective view of the inverter 200.

FIG. 4 is an exploded perspective view of the inverter 200. The inlet pipe 13 for introducing the coolant, and the outlet pipe 14 for discharging the coolant are arranged on the same sidewall of the case 10. Cooling blocks 12a, 12b, and 12c are arranged in a substantially U-shape on the bottom side inside the case 10. Note that the cooling block 12c is not viewable in FIG. 4 since it is arranged parallel to and on the opposite side of the cooling block 12a. A coolant path 19 (see FIG. 7), which will be described later, is formed in the cooling blocks 12a, 12b, and 12c. The coolant flowing in from the inlet pipe 13 flows through the coolant path 19 inside the cooling blocks 12a to 12c, and flows out from the outlet pipe 14.

In the cooling blocks 12a and 12c arranged parallel to each other, a plurality of openings 400 is formed to install power semiconductor modules 300a to 300c inside the coolant paths. In the example illustrated in FIG. 4, two openings 400 are formed in the cooling block 12a on the left side of the drawing, and the power semiconductor modules 300a and 300b are installed in these two openings 400, respectively. On the other hand, although not viewable in the drawing, one opening 400 is formed in the cooling block 12c arranged parallel to and on the opposite side of the cooling block 12a. The power semiconductor module 300c is installed in this opening 400. These openings 400 are closed by installing the power semiconductor modules 300a to 300c in the cooling blocks 12a and 12c.

Figure 5:
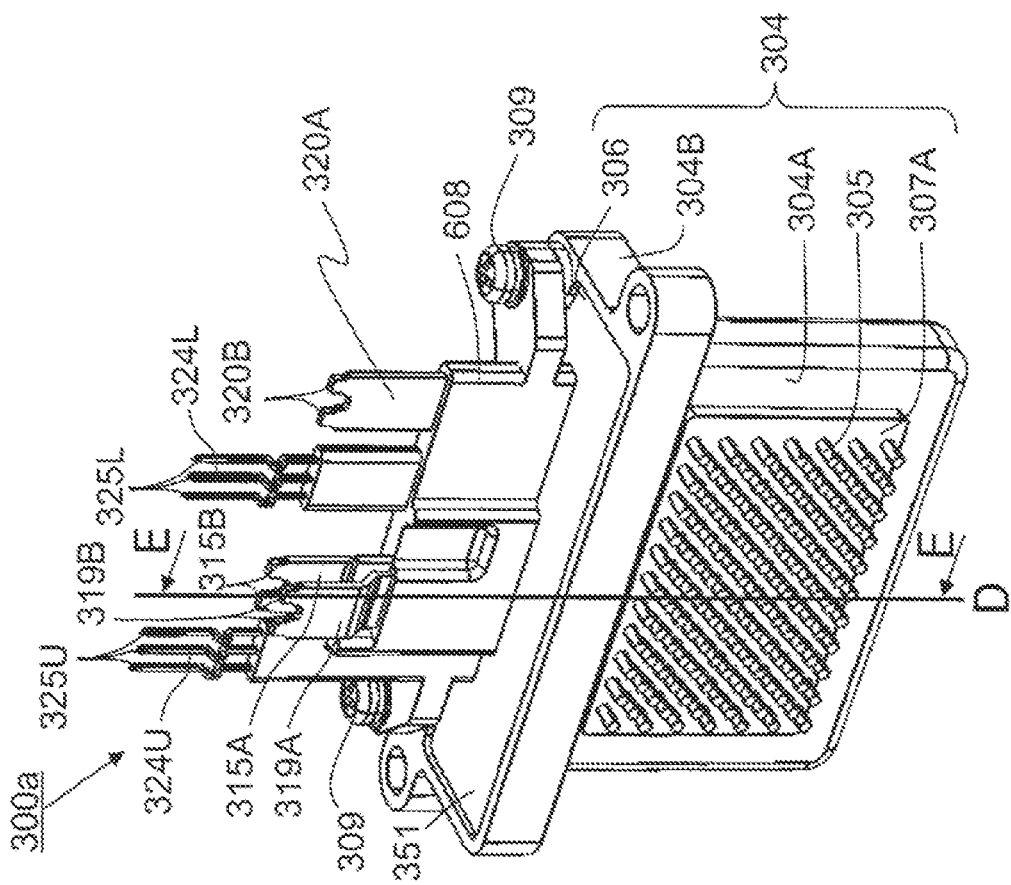
Figure 6:
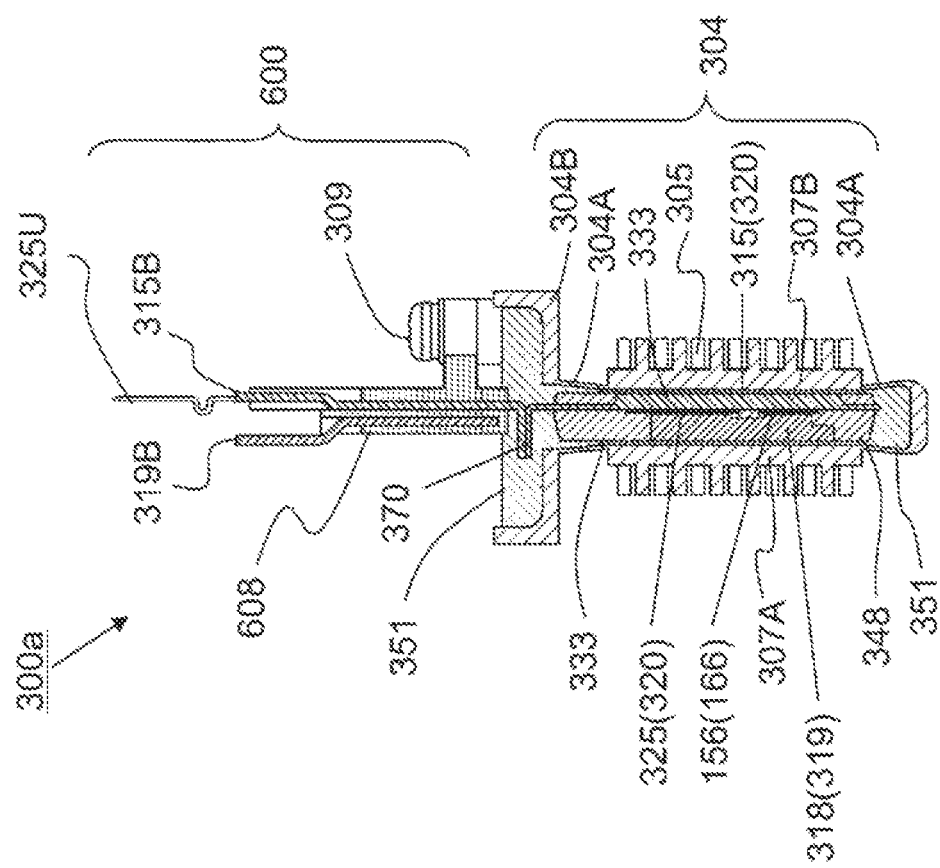

FIGS. 5 and 6 are views illustrating the power semiconductor module 300a. Note that a description will be given for the power semiconductor module 300a as a representative because all of the power semiconductor modules 300a to 300c have the same structure. FIG. 5 is the perspective view illustrating an external appearance of the power semiconductor module 300a, and FIG. 6 is the cross-sectional view of the power semiconductor module 300a taken along a line D, viewed from a direction E.

Meanwhile, in FIGS. 5 and 6, a signal terminal 325U corresponds to the gate electrode 154 and the emitter electrode 155 for signals disclosed in FIG. 3, and a signal terminal 325L corresponds to the gate electrode 164 and the emitter electrode 165 disclosed in FIG. 3. Also, a DC positive terminal 315B is identical to the positive terminal 157 disclosed in FIG. 3, and a DC negative terminal 319B is identical to the negative terminal 158 disclosed in FIG. 3. Further, an AC terminal 32013 is identical to the AC terminal 159 disclosed in FIG. 3.

FIG. 6 is the cross-sectional view illustrating a portion where the IGBT 328 and the diode 156 are arranged in the series circuit 150 having the upper and lower arms. The IGBT 330 and the diode 166 are arranged in parallel to the IGBT 328 and the diode 156 in the vertical direction of the drawing. The IGBT 328 and the diode 156 are firmly fixed between the conductor plates 315 and 318 in a sandwiched manner. Similarly, the IGBT 330 and the diode 166 are firmly fixed between the conductor plates 319 and 320 in a sandwiched manner. The conductor plates, such as the conductor plate 315, are sealed by a first encapsulation resin 348 with a heat dissipating surface thereof exposed. An insulation sheet 333 is bonded to the heat dissipating surface by thermocompression.

A module primary encapsulation case sealed by the first encapsulation resin 348 is inserted into a module case 304, and bonded to an inner surface of the module ease 304 by thermocompression, sandwiching the insulation sheet 333. The module case 304 is a CAN type cooler. Here, the CAN type cooler is a cylindrically-shaped cooler having an insertion slot 306 (FIG. 5) on one face, and a bottom on the other face. A clearance remaining inside the module case 304 is filled with a second encapsulation resin 351.

The module case 304 is formed of a member having electrical conductivity, such as aluminum alloy material (Al, AlSi, AlSiC, Al—C, etc.), and integrally molded in a seamless manner. The module case 304 does not include any opening except for the insertion slot 306 whose outer circumference is surrounded by a flange 304B.

Further, a first heat dissipating surface 307A and a second heat dissipating surface 307B having faces larger than other faces are arranged facing each other. The respective power semiconductor devices (IGBT 328, IGBT 330, diode 156, and diode 166) are arranged to face these dissipating surfaces. The three surfaces, which connect the first heat dissipating surface 307A and the second heat dissipating surface 307B facing each other, are formed of the hermetically sealed faces having widths narrower than those of the first heat dissipating surface 307A and the second heat dissipating surface 307B, and the insertion slot 306 is formed on a face on the remaining side. The shape of the module case 304 does not have to be an accurate cuboid, and may include a curved surface as illustrated in FIG. 5 and FIG. 6.

By adopting the metal-made case of such a shape, sealing against the coolant may be ensured by the flange 304B even though the module case 304 is inserted into the coolant path 19 where the coolant, such as water or oil, flows. As a result, the coolant may be prevented from entering the module case 304 with a simple structure. Further, fins 305 are uniformly formed on the first heat dissipating surface 307A and the second heat dissipating surface 3079 facing each other. Moreover, curved portions 304A with an extremely small thickness are formed on the outer peripheries of the first heat dissipating surface 307A and the second heat dissipating surface 307B. The curved portion 304A is formed extremely thin to the extent that it can he easily deformed by pressing the fins 305. As a result, productivity is improved after the module primary encapsulation case is inserted.

As illustrated in FIG. 5, a DC positive wiring 315A and a DC negative wiring 319A, which are made of metal, are provided outside the module case 304 in order to electrically connect to the capacitor module 500. At the tips of the DC positive wiring 315A and the DC negative wiring 319A, the DC positive terminal 315B (157) and the DC negative terminal 319B (158) are formed, respectively. Further, an AC wiring 320A made of metal is provided to supply AC power to the motor generator MG1, and an AC terminal 320B (159) is formed at the tip thereof. According to the present embodiment, the DC positive wiring 315A is connected to the conductor plate 315, the DC negative wiring 319A is connected to the conductor plate 319, and the AC wiring 320A is connected to the conductor plate 320.

Further, signal wirings 324U and 324L made of metal are provided outside the module case 304 in order to electrically connect to the driver circuit 174. At the tips of the signal wirings 324U and 324L, a signal terminal 325U (154, 155) and a signal terminal 325L (164, 165) are formed, respectively. According to the present embodiment, the signal wiring 324U is connected to the IGBT 328, and the signal wiring 324L is connected to the IGBT 330.

The DC positive wiring 315A, the DC negative wiring 319A, the AC wiring 320A, the signal wiring 324U, and the signal wiring 324L are integrally molded as an auxiliary molded body 600, mutually insulated by a wiring insulating portion 608 molded by resin material. The wiring insulating portion 608 also functions as a supporting member for supporting the respective wirings. A suitable resin material used for the wiring insulating portion 608 is thermosetting resin or thermoplastic resin having insulation properties. This may ensure insulation properties among the DC positive wiring 315A, the DC negative wiring 319A, the AC wiring 320A, the signal wiring 324U, and the signal wiring 324L, and may provide a high density wiring.

The auxiliary molded body 600 is connected to the module primary encapsulation case by metal-jointing, and then fixed to the module case 304 with a screw 309 which penetrates a screw hole provided at the wiring insulating portion 608. To join the auxiliary molded body 600 to the module primary encapsulation case by metal-jointing at a connecting portion 370, TIG welding may he applied, for example.

The DC positive wiring 315A and the DC negative wiring 319A are laminated facing each other, sandwiching the wiring insulating portion 608 therebetween, and extend substantially in parallel. With this arrangement and form, the current, which instantaneously flows when switching is executed at the power semiconductor devices, counterflows in the opposite direction. This allows magnetic fields produced by the currents to cancel each other, thereby reducing the inductance. Meanwhile, the AC wiring 320A, the signal terminals 325U and 325L also extend in the same direction as the DC positive wiring 315A and the DC negative wiring 319A.

The connecting portion 370, at which the module primary encapsulation case and the auxiliary molded body 600 are connected by metal-jointing, is sealed by the second encapsulation resin 351 inside the module case 304. This may stably ensure an insulation distance required between the connecting portion 370 and the module case 304. As a result, the power semiconductor module 300a may be downsized in comparison With the case where the connecting portion 370 is not sealed.

Referring back to FIG. 4, an area surrounded by the cooling blocks 12a to 12c formed in a substantially U-shape includes a housing space 405 for housing the capacitor module 500. The capacitor module 500 housed in the housing space 405 is cooled by the coolant flowing in the coolant paths inside the cooling blocks 12a to 12c. Thus, the capacitor module 500 is effectively cooled since it is arranged in a manner surrounded by the cooling blocks 12a to 12c provided with the coolant paths.

Further, since the coolant paths are formed along the outer surface of the capacitor module 500, the coolant paths, the capacitor module 500, and the power semiconductor modules 300a to 300c are orderly arranged, thereby reducing the entire size. Also, the coolant paths are arranged along the longitudinal side of the capacitor module 500, and a distance between the power semiconductor modules 300a to 300c to be inserted and the cooling paths is substantially constant. As a result, circuit constants of a smoothing capacitor and the power semiconductor module circuit may be easily balanced in the respective three phases, and spike voltage may be easily reduced in this circuit configuration. In the present embodiment, the most suitable coolant is water. However, coolant other than water may be used as well.

A bus bar assembly 800 is arranged above the capacitor module 500. The bus bar assembly 800 is provided with an AC bus bar, and a holding member which holds the AC bus bar. The bus bar assembly 800 further holds the current sensor 180. The cooling blocks 12a to 12c and the case 10 are integrally formed by aluminum casting, thereby providing an effect of enhancing mechanical strength of the case 10 in addition to the cooling effect. Also, thermal conductance is improved in the entire inverter 200, thereby improving the cooling efficiency. Of course, the cooling blocks 12a to 12c and the case 10 can be formed separately.

A driver circuit board 22 is arranged above the bus bar assembly 800. Further, a metal base plate 11 is arranged between the driver circuit board 22 and a control circuit board 20. The metal base plate 11 is fixed to the case 10. The metal base plate 11 functions as an electromagnetic shield for a group of the circuits mounted on the driver circuit board 22 and the control circuit board 20. Also, the metal base plate 11 functions to release the heat generated by the driver circuit board 22 and the control circuit board 20 for cooling.

Further, the metal base plate 11 functions to increase mechanical resonance frequency of the control circuit board 20. In other words, screw fastening portions to fix the control circuit board 20 to the metal base plate 11 may be arranged at short intervals, and a distance between the supporting points may be shortened in the event of mechanical vibrations, thereby increasing the resonance frequency. The resonance frequency of the control circuit board 20 may be increased relative to a vibration frequency transmitted from the engine and the like. As a result, influence of the vibration is hardly received and reliability is increased. A cover 8 is fixed to the metal base plate 11 and protects the control circuit board 20 from external, electromagnetic noise.

A portion in which the cooling blocks 12a to 12c are housed is substantially cuboid-shaped in the case 10 according to the present embodiment, but a protruded housing portion 10g is formed, protruding from a side surface of the case 10. A terminal 102 extending from the DC/DC converter 100, the bus bar assembly 800 on the DC side, and a resistor 450 are housed in the protruded housing portion 10g. Here, the resistor 450 is a resistor element to discharge the charge accumulated in a capacitor element, of the capacitor module 500. Thus, the electrical circuit components between the battery 136 and the capacitor module 500 are collectively arranged in the protruded housing portion 10g. As a result, complexity of wirings may be suppressed and the entire device size may be reduced.

Meanwhile, a cover 18 is a member to close a work window 17 used for connecting the terminal 102 extending from the DC/DC converter 100. Further, the DC/DC converter 100 includes an opening 101 formed in a surface facing the bottom face of the case 10. The terminal 102 penetrates the opening 101.

Thus, the cooling blocks 12a to 12c are arranged on the bottom side of the inverter 200, and subsequently the capacitor module 500, the bus bar assembly 800, and other necessary components such as the boards are sequentially fixed from the top, thereby improving productivity and reliability.

Figure 7:
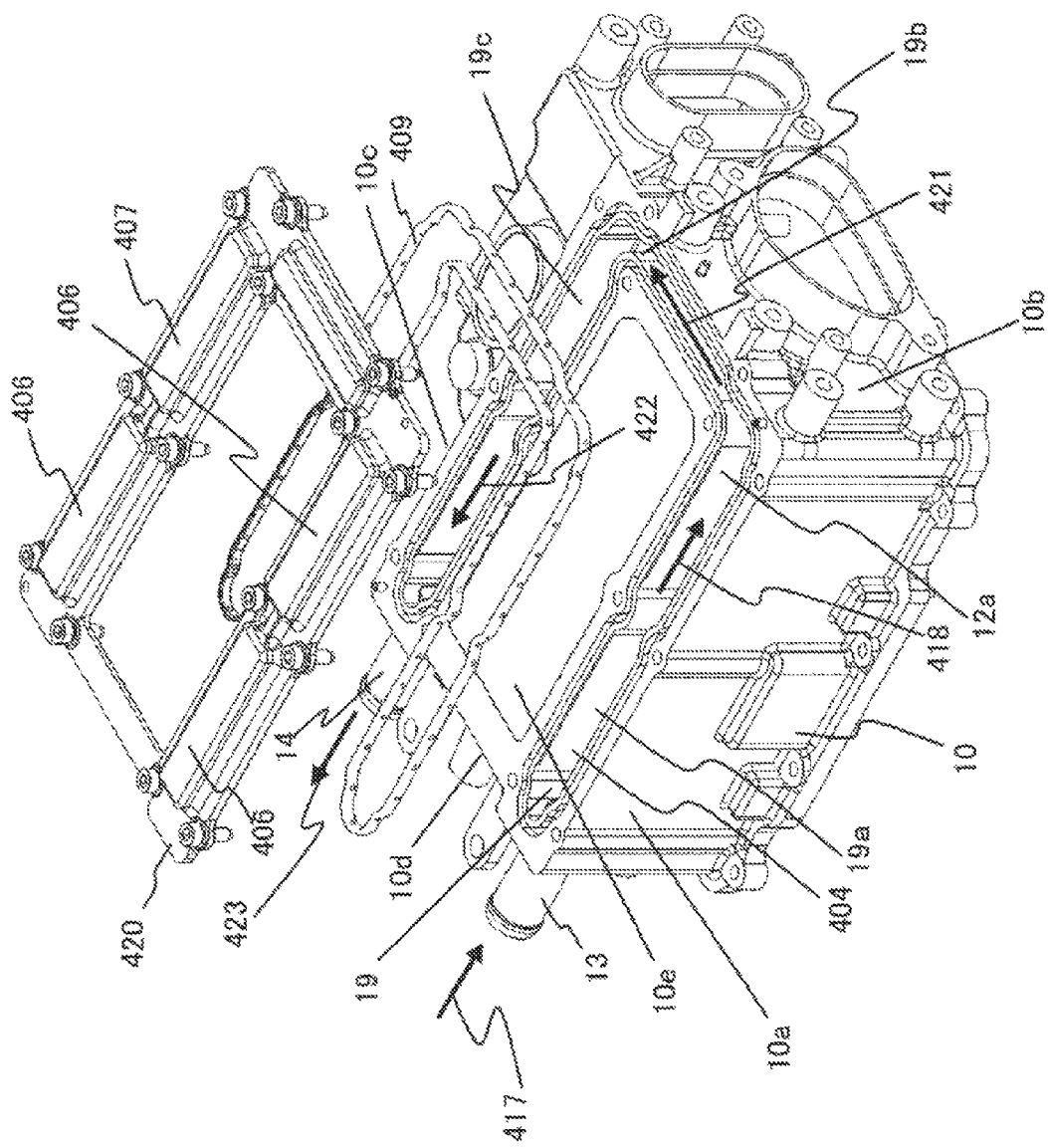
FIG. 7 is a view from a bottom face side of a case 10, in which a bottom cover 420 is provided.

FIG. 7 is a view from a bottom face side of the case 10, in which a bottom cover 420 is provided. The case 10 is cuboid-shaped and includes four sidewalls 10a, 10b, 10c, and 10d. An opening 404 of the coolant path 19 is formed on the bottom face side of the case 10. The substantially U-shaped coolant path 19 is formed of three linear coolant path sections (first coolant path section 19a, second coolant path section 19b, and third coolant path section 19c). The opening 404 Is also substantially U-shaped and closed with the bottom cover 420. A sealing member 409 is provided between the bottom cover 420 and the case 10 to maintain airtightness.

On the bottom cover 420, three projected portions 406 and one projected portion 407, which project in a direction opposite to the coolant path 19, are formed at positions facing the first coolant path section 19a and the third coolant path section 19c. The three projected portions 406 are provided corresponding to the respective power semiconductor modules 300a to 300c. On the other hand, the projected portion 407 formed at a position corresponding to the third coolant path section 19c is provided in order to adjust the cross-sectional area of the coolant path 19. Therefore, no power semiconductor module is disposed in this portion. The projected portion 407 has the same shape as the projected portion 406. An area indicated by a reference sign 10e is a bottom portion of the housing space 405 (see FIG. 4) that houses the capacitor module 500.

The coolant flows into the inlet pipe 13 as indicated by an arrow 417, and then flows inside the first coolant, path section 19a formed along the longitudinal side of the case 10 in a direction of an arrow 418. Further, the coolant flows in a direction or an arrow 421 inside the second coolant path section 19b formed along the short-length side of the case 10. This second coolant path section 19b is formed as a folded coolant path. After that, the coolant flows inside the third coolant path section 19c of the cooling block 12c formed along the longitudinal side of the case 10. The third coolant path section 19c is arranged in parallel to the first coolant path section 19a, interposing the capacitor module 500. The coolant flows out from the outlet pipe 14 as indicated by an arrow 423.

The depths of all of the first coolant path section 19a, the second coolant path section 19b, and the third coolant path section 19c are formed larger than the widths thereof. Additionally, in the cooling blocks 12a to 12c, the plurality of openings 400 is formed so as to face the opening 404 formed on the back face of the case 10. Therefore, the cooling blocks 12a to 12c and the case 10 are easily manufactured by aluminum casting.

Figure 8:
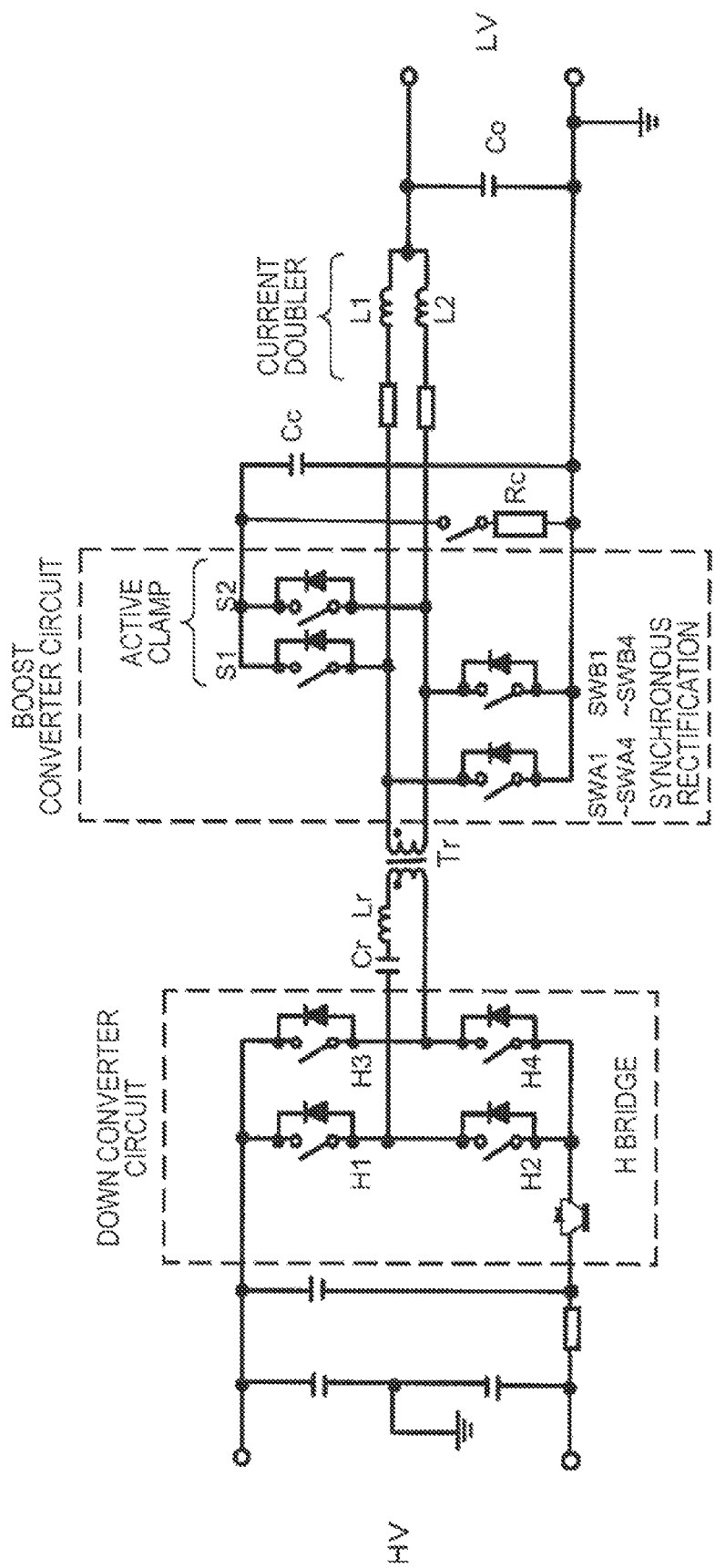
FIG. 8 is a diagram illustrating a circuit configuration of a DC/DC converter 100.

Next, a description will be given for the DC/DC converter 100. FIG. 8 is a diagram illustrating a circuit configuration of the DC/DC converter 100. As illustrated in FIG. 8, the DC/DC converter 100 according to the present embodiment is compatible with bidirectional DC/DC converting. For this reason, the down converter circuit (HV circuit) and the boost converter circuit (LV circuit) are configured as synchronous rectification circuits, not as diode rectification circuits. Also, to provide high power output by the HV/LV converting, a large-current component is adopted for a switching device, and a smoothing coil is enlarged.

More specifically, both the HV side and the LV side include H-bridge type synchronous rectification switching circuits (H1 to H4) in which a MOSFET having a recovery diode is utilized. For switching control, an LC serial resonance circuit (Cr, Lr) is used to execute zero cross switching at a high switching frequency (100 kHz) so as to improve conversion efficiency and reduce heat loss. Additionally, an active clamp circuit is provided to reduce the loss caused by cyclic current at the time of voltage step-down operation, and the withstanding voltage of the switching device is reduced by suppressing generation of surge voltage at the time of switching. Thus, the device is downsized by reducing the withstanding voltage of the circuit components.

Moreover, a full-wave rectification double-current (current doubler) technology is applied to ensure high power output on the LV side. Additionally, a plurality of switching devices is simultaneously actuated in parallel to ensure high power output. According to the example of FIG. 8, four switching devices, such as SWA1 to SWA4, and SWB1 to SWB4, are provided in parallel. Also, two sets of the switching circuits, and two compact reactors (L1, L2) are arranged in parallel to be symmetric, thereby attaining high power output. The compactor reactors are smoothing reactors. Thus, arrangement of the two compact reactors (L1, L2) may reduce the entire size of the DC/DC converter, in comparison with a case where one large reactor is arranged.

Figure 9:
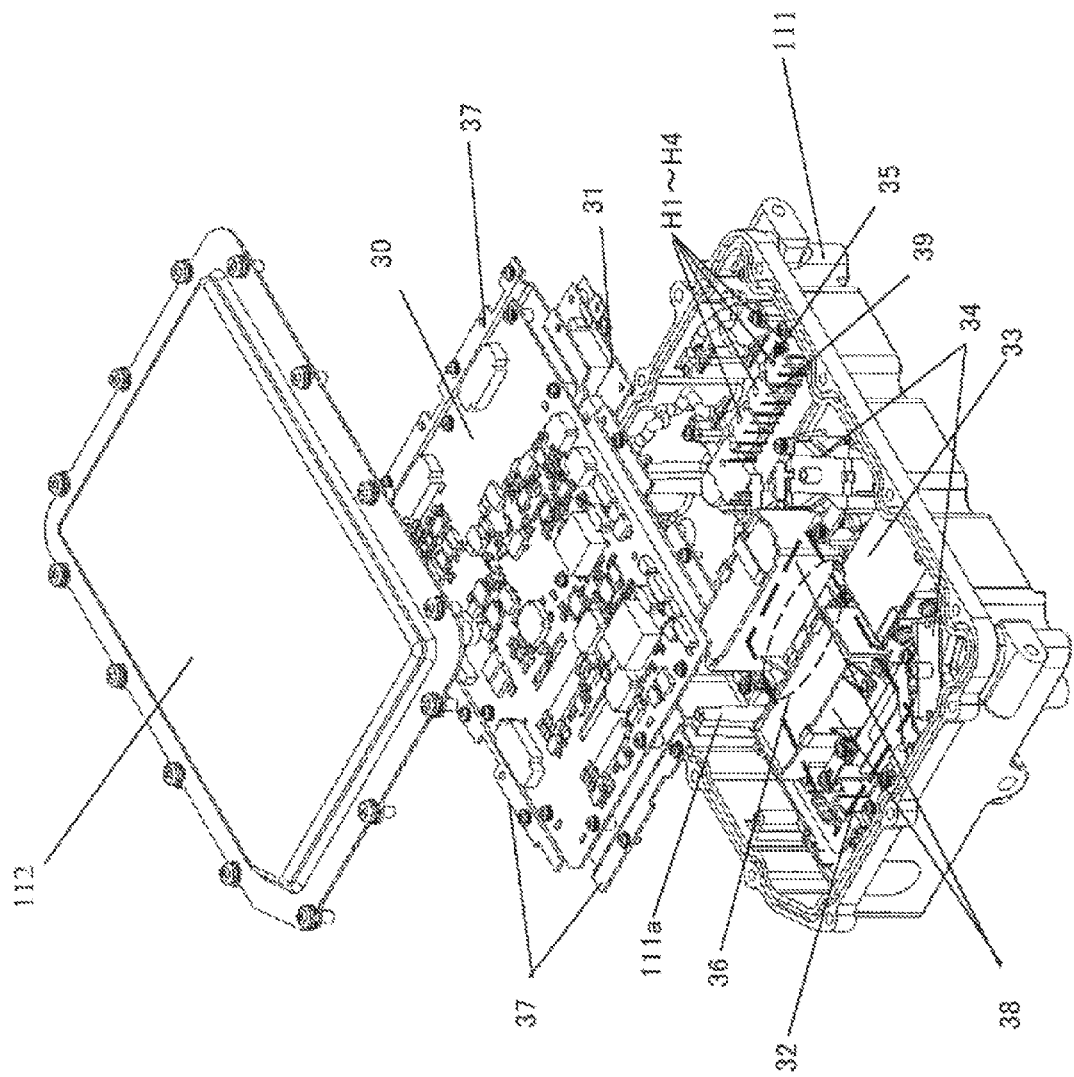
FIG. 9 is an exploded perspective view illustrating arrangement of the components in the DC/DC converter 100.
Figure 10:
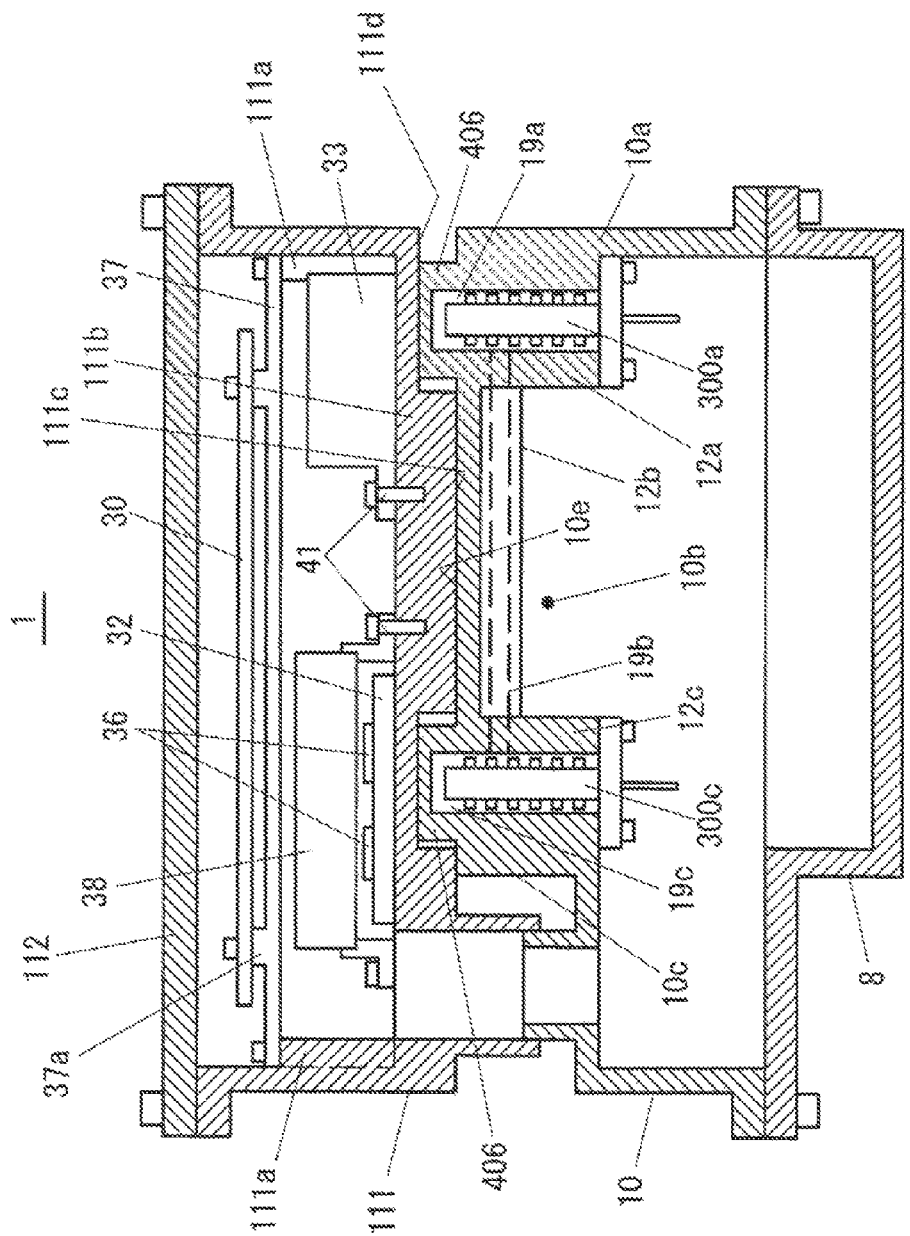
FIG. 10 is a cross-sectional view of the power converter 1.
Figure 11:
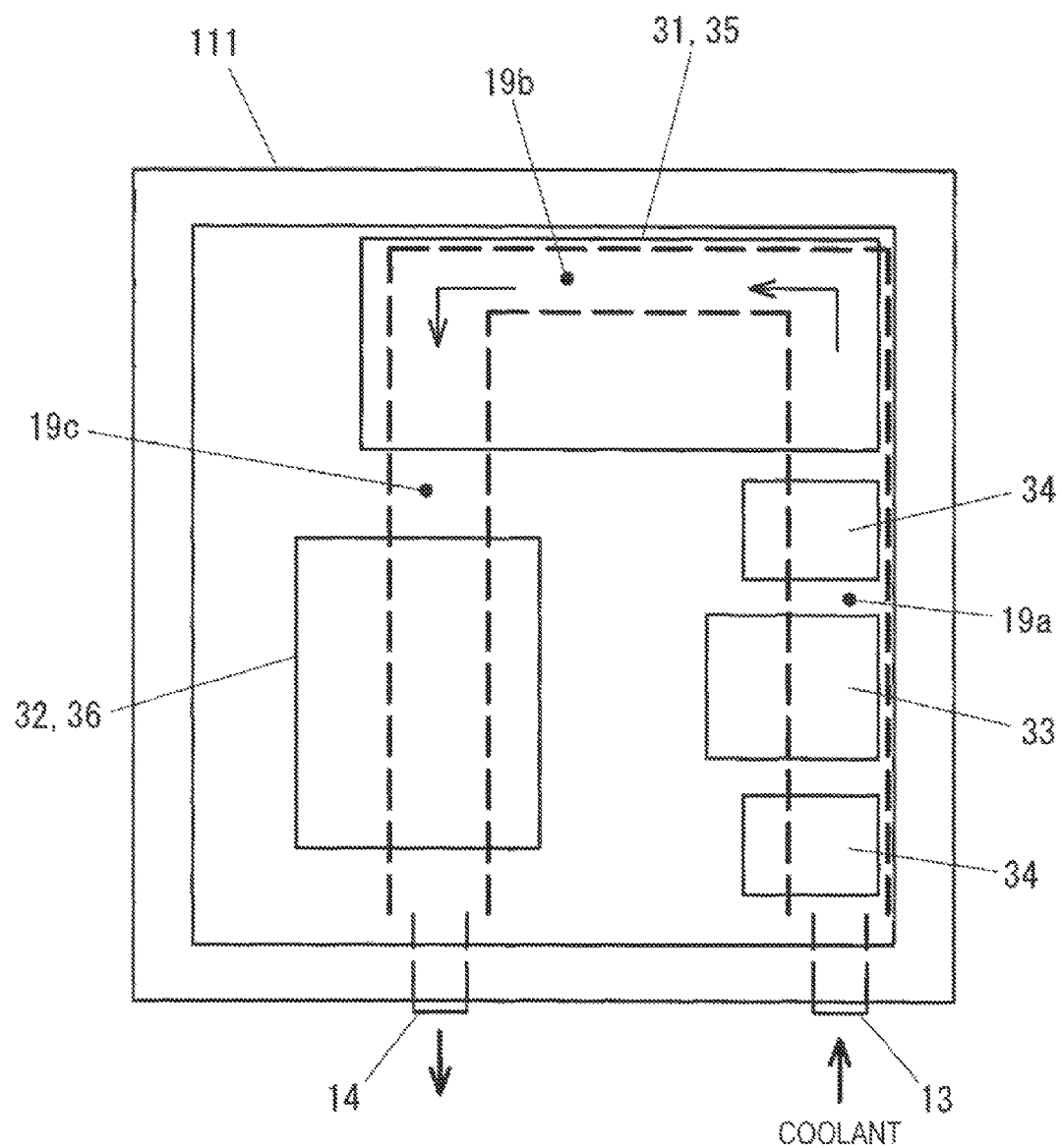
FIG. 11 is a schematic view illustrating arrangement of the components inside a case of the DC/DC converter 100.

FIGS. 9, 10, and 11 are views illustrating arrangement of the components in the DC/DC converter 100. FIG. 9 is the exploded perspective view of the DC/DC converter 100. FIG. 10 is the cross-sectional view of the power converter 1 in which the DC/DC converter 100 and the inverter 200 are integrated. FIG. 11 is a schematic view illustrating arrangement of the components inside the case of the DC/DC converter 100.

As illustrated in FIG. 9, the circuit components of the DC/DC converter 100 are housed inside the case 111 made of metal (e.g., aluminum die casting). A case cover 112 is fixed to an opening of the case 111 with bolts. As described above, the case 10 of the inverter 200 is fixed to the bottom face side of the case 111. A main transformer 33, inductance devices 34, the power semiconductor module 35, a boost circuit board 32, capacitors 38, and the like are mounted on the bottom face portion inside the case. The switching devices H1 to H4 are mounted on the power semiconductor module 35, and the switching devices 36 are mounted on the boost circuit board 32. Main heating components are the main transformer 33, the inductance devices 34, the power semiconductor module 35, and the switching devices 36.

Meanwhile, describing correspondence to the circuit diagram in FIG. 8, the main transformer 33 corresponds to the transformer Tr, the inductance devices 34 correspond to the reactors L1 and L2, which are current doublers, and the switching devices 36 correspond to the switching devices SWA1 to SWA4, and SAWB1 to SWB4, respectively. The switching devices S1 and S2 in FIG. 8, for example, are also mounted on the boost circuit board 32.

Terminals 39 of the switching devices H1 to H4 extend upward in the case, and are connected to a down circuit board 31 arranged above the power semiconductor module 35. The down circuit board 31 is fixed above a plurality of supporting members projected upward from the bottom face of the case. In the power semiconductor module 35, the switching devices H1 to H4 are mounted on a metal board on which patterns are formed, and a back face of the metal board is fixed to the bottom face of the case in an adhering manner. The boost circuit board 32 on which the switching devices 36 are mounted is formed of a similar metal board in FIG. 9, the boost circuit board 32 is indicated with a dashed line since it is hidden beneath the capacitors 38 and other components.

A control circuit, which controls the switching devices provided on the boost converter circuit and the down converter circuit, is mounted on the control circuit board 30. The control circuit board 30 is fixed above a base plate 37 made of metal. The base plate 37 is fixed to a plurality of supporting portions 111a projected upward from the bottom face portion of the case 111. This allows the control circuit board 30 to be arranged, via the base plate 37, above the heating components (main transformer 33, inductance devices 34, power semiconductor module 35, etc.) arranged on the bottom face portion of the case.

A description will be given for the components provided in the DC/DC converter 100 with reference to FIGS. 10 and 11. Note that, in the cross-sectional view in FIG. 10, only the power semiconductor modules 300a to 300c installed in the cooling blocks 12a to 12c are illustrated as the components housed inside the inverter 200. As described above, the cooling blocks 12a to 12c are provided along the respective sidewalls 10a, 10b, and 10c inside the case 10 of the inverter 200.

The first coolant path section 19a is formed in the cooling block 12a along the sidewall 10a, the second coolant path section 19b is formed in the cooling block 12b along the sidewall 10b, and the third coolant path section 19c is formed in the cooling block 12c along the sidewall 10c. The power semiconductor module 300a is inserted into the first coolant path section 19a, and the power semiconductor module 300c is inserted into the third coolant path section 19c. Further, the power semiconductor module 300b is inserted into the first coolant path section 19a although not illustrated.

In the case 111 of the DC/DC converter 100, the depressed portion 111d and a projected portion 111c are formed on an outer peripheral surface of a case bottom portion 111b. As illustrated in FIG. 1, the depressed portion 111d of the case 111 is formed on an area facing at least the projected portion 406 provided on the outer peripheral surface of the bottom portion of the case 10. In other words, the depressed portion hid faces the coolant path sections 19a, 19b, and 19c via the projected portion 406. Further, the projected portion 111c is formed so as to face an area surrounded by the projected portions 406 on the outer peripheral surface of the bottom portion of the case 10.

Sealing material (heat dissipation sheet, thermal conductive grease) having excellent heat conductive performance is provided between the case 111 and the case 10 although not illustrated in FIG. 10. The main transformer 33 is fixed to an inner peripheral surface of the case facing the first coolant path section 19a. On the other hand, the boost circuit board 32, on which the switching devices 36 are mounted, and the capacitor 38 are fixed to the inner peripheral surface of the case facing the third coolant path section 19c. The main transformer 33, the boost circuit board 32, the capacitor 38, and so on are screwed with bolts 41 and the like to the bottom face portion of the case 111. Screw holes are formed in an area having the thick case bottom portion, such as the projected portion 111c. Further, in the case of arranging a component on a case bottom face portion not facing the coolant path sections 19a, 19b, and 19c, the thickness of the corresponding bottom portion is made thick such that the component may contact the case 10. As a result, cooling efficiency of the component may be improved.

The base plate 37 is fixed, with bolts, to the supporting portions 111a formed in the case 111. The control circuit board 30 is fixed, with bolts and the like, on projected portions 37a formed on the upper surface of the base plate 37. The case cover 112 is fixed to the opening of the case 111 to hermetically seal the inside of the case.

The bottom face portion (depressed portion 111d, projected portion 111c, etc.) of the case 111 thermally contacts the case 10 of the inverter 200. Therefore, the bottom face portion indirectly cooled by the coolant flowing in the coolant path sections 19a to 19c of the case 10. Cooling is effectively performed by a fixing the components onto the bottom face portion of the case. Particularly, in the case of a component having a high heat value, cooling effect may be improved by arranging the component in an area contacting projected portion 406 of the bottom cover 420 which direct contacts the coolant. Also, since the base plate 37 is made of metal, the heat generated in control circuit board 30 transmitted to the case 10 via the supporting portions 111a and the case 111. Additionally, the base plate 37 functions as a shielding member to shield radiation heat from the heating components provided on the case bottom face portion. Also, in the case where the base plate 37 is made of copper material, for example, the base ate functions as a shield to shield switching radiation noise from the switching device.

FIG. 11 is a plan view illustrating arrangement of the heating components provided on the bottom face portion of the case 111 with the case cover 112 removed. The dashed lines indicate arrangement of the coolant path sections 19a to 19c provided in the case 10 of the inverter 200. The coolant path sections 19a to 19c are formed in the substantially U-shape with respect to the bottom face portion of the case 111, and the first coolant path section 19a and the third coolant path section 19c are arranged in parallel. The coolant flowing from the inlet pipe 13 into the first coolant path section 19a sequentially flows to the second coolant path section 19b, and to the third coolant path section 19c, and then flows out from the outlet pipe 14.

The main transformer 33 and two inductance devices 34 are arranged on the case bottom face portion facing the first coolant path section 19a. Further, the power semiconductor module 35 and the down circuit board 31, which configure the down converter circuit, are mainly arranged on the case bottom face portion facing the second coolant path section 19b. The switching device 36 and the boost circuit board 32, which configure the boost converter circuit, are arranged on the case bottom face portion facing the third coolant path section 19c. Thus, the components having relatively high heat values are arranged at the positions facing the coolant path sections 19a to 19c so as to obtain high cooling efficiency.

Meanwhile, the outer peripheral surface of the bottom face portion of the case 111 may be formed flat instead of the structure with projection/depression as illustrated in FIG. 10. Even in such a case, cooling efficiency may be improved for the heating components by arranging the heating components on the case bottom face portion contacting the projected portion 406, that is, the case bottom face portion facing the coolant path sections 19a to 19c. However, in the case of fixing the component to the case bottom face portion, for example, with the bolts 41 as illustrated in FIG. 10, it is necessary to form the bottom portion thick, considering the depth of the screw hole, like the projected portion 111c. Therefore, in the case of forming the outer peripheral surface of the bottom face portion of the case 111 flat, there is a disadvantage that a total height of the case 111 becomes higher than in the case of forming the outer peripheral surface of the bottom face portion in the structure with projection/depression as illustrated in FIG. 10.

Moreover, a contact area may be enlarged by forming a contact face between the case 111 and the case 10 in the structure with projection/depression. As a result, cooling performance for the case 111 may be more improved. Also, cooling efficiency may be improved for the components arranged on the case bottom face portion not facing the coolant path sections 19a to 19c by the projected portion 111c of the case 111 contacting the depressed portion 10e of the case 10.

Figure 12:
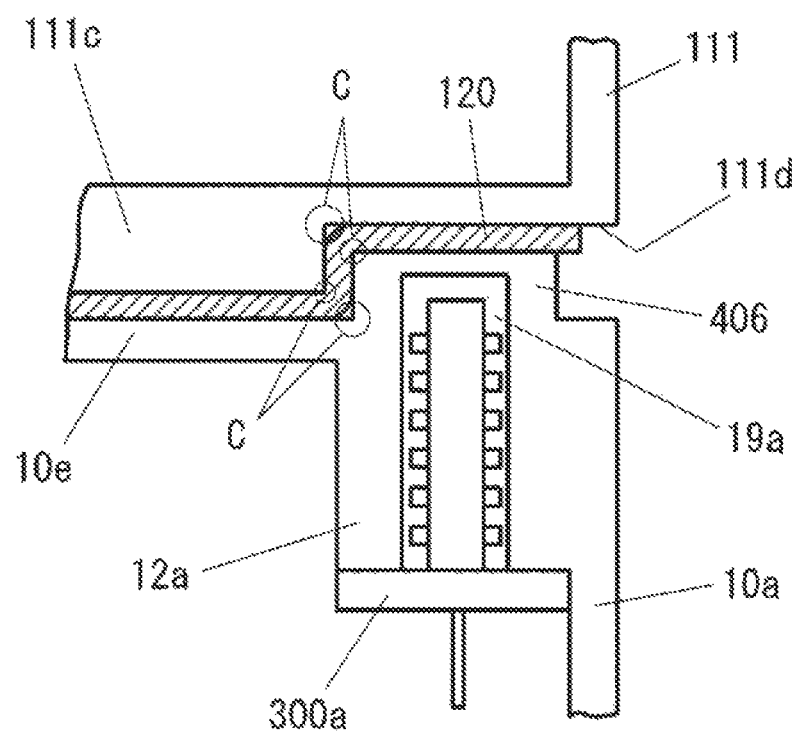
FIG. 12 is an enlarged view of a portion where a projected portion 406 contacts a depressed portion 111$d$ of FIG. 10.

Next, a description is given for cross-sectional shapes of the projected/depressed surfaces in the structure with projection/depression. FIG. 12 is an enlarged view of a portion where the projected portion 406 contacts the depressed portion 111d in FIG. 10. A heat dissipation sheet 120 is disposed between the case 111 and the case 10 to improve neat-transfer performance. For the heat dissipation sheet 120, a heat radiating silicone rubber sheet is used, for example.

In the example illustrated in FIG. 12, the side surfaces of both the projected portion 406 and the projected portion 111c are vertical having an inclination angle of 0 degree. In other words, the side surface of the projected portion 406 and the side surface of the depressed portion 111d, to which the projected portion 406 is fitted, are vertical. The heat dissipation sheet 120 obtains appropriate radiation characteristics being sandwiched between the case 111 and the case 10 and compressed slightly to obtain an appropriate surface pressure. However, in the case where the side surfaces of the projected portions 406 and 111c are vertical, the heat dissipation sheet may not obtain the appropriate surface pressure, and also may form some clearance at corners C as illustrated in FIG. 12 because the heat dissipation sheet is to be disposed in a predetermined vertical space.

To solve this, the side surface 111f (also the side surface of the depressed portion 111d) of the projected portion 111c is inclined at an inclination angle $\theta 1$ (<90 degrees), and further the corresponding side surface 10f of the projected portion 406 is inclined at an inclination angle $\theta 2$ (<90 degrees), as illustrated in FIG. 13. The inclination angles $\theta 1$ and $\theta 2$ are set smaller than 90 degrees, but preferably in the range of approximately 30 to 45 degrees. By thus inclining the side surfaces 111f and 10f at an inclination angle smaller than 90 degrees, the heat dissipation sheet 120 disposed on the inclined surfaces may be compressed to obtain the appropriate surface pressure when the case 111 is fitted to the case 10. Also, the angle at the corner becomes larger than 90 degrees and gradual, thereby hardly forming the clearance at the corner.

Further, by setting the inclination angles $\theta 1$ and $\theta 2$ to be $\theta 1 < \theta 2$, the heat dissipation sheet 120 on the inclined surfaces is pushed toward the case 10 when the heat dissipation sheet 120 is compressed by biasing the case 111 in the direction of the case 10 as indicated by an arrow in FIG. 13(b). As a result, the heat dissipation sheet 120 is fitted into the corners, and a function no prevent the clearance from being formed at the corners may be improved.

Further, the thermal conductive grease may also be embedded into the space between the cases, instead of the heat dissipation sheet 120. Specifically, the grease is applied to all over the surfaces of the cases 10 and 111 facing each other so as to fix the case Ill to the case 10. In this case also, if the side surfaces of the projected portions 111c and 406 are vertical, it is difficult to apply the grease to the space between the vertical side surfaces without forming any clearance. On the other hand, the grease may be applied without forming any clearance by inclining the side surfaces of the projected portions 406 and 111c. For example, in the case where the power converter 1 is housed inside a vehicle bonnet (e.g., engine room) and there is some clearance not covered with the grease, cooling performance at that portion may be degraded because of the influence of air, humidity, water, and so on However, by setting the space between the case Ill and the case 10 extremely small (as small as seemingly zero), the grease may be applied to all over the surfaces without any clearance because of capillary permeability. Also, the influence of the water, for example, may be prevented by the grease which is hardened as the solvent evaporates.

Figure 14:
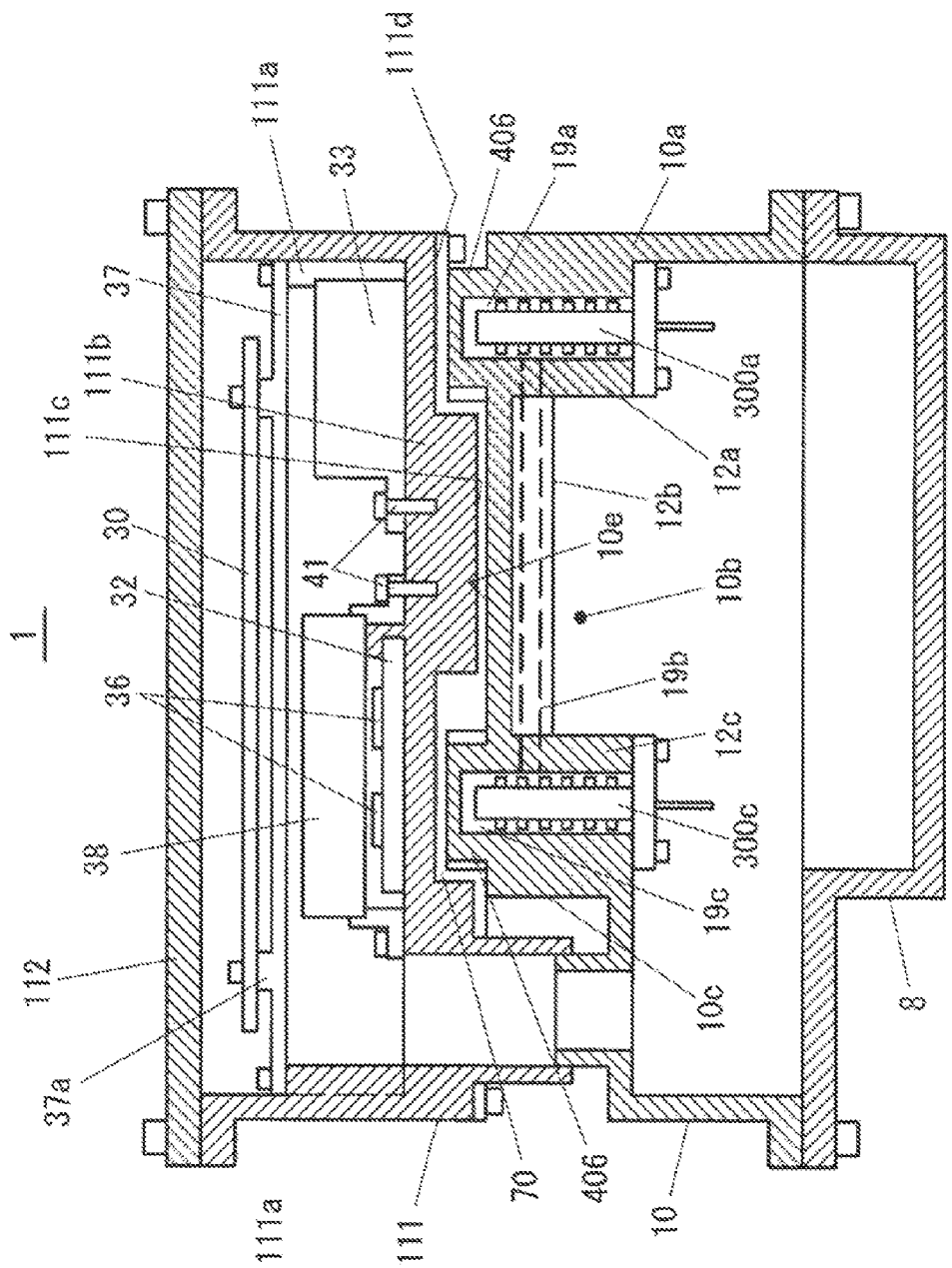
FIG. 14 is a view illustrating an adapter base plate 70.

The inverter is the component for power-driving used in common in the HEV (hybrid electric vehicle), PHEV (plug-in hybrid electric vehicle), or the EV, and generally used regardless of vehicle types. On the other hand, the DC/DC converter is mounted on the PHEV or the EV, and generally varied depending on the vehicle type. Also, the DC/DC converter needs to cope with different DC/DC capacity in accordance with an LV battery load. Therefore, there may be a case where the shape of the fitting surface slightly differs from that of the inverter 200 depending on a model of the DC/DC converter 100. In such a case, the difference between the fitting surfaces may be resolved by disposing an adapter base plate 70 between the DC/DC converter 100 and the inverter 200 as illustrated in FIG. 14. Here, the structure including the inclined surfaces as illustrated in FIG. 13 is adopted for the fitting portion.

The above-described power converter 1 according to the present embodiment provides the following functions and effects. (1) The power converter 1 includes the inverter 200 housed in the case 10, and the DC/DC converter 100 housed in the case 111 fixed detachably to the case 10. The inverter 200 is provided with a plurality of power semiconductor modules 300 which outputs alternate current. The DC/DC converter 100 is provided with the down converter circuit and/or the boost converter circuit. Further, the case 10 includes the cooling block 12a thermally contacting the case 111, and the cooling block 12c thermally contacting the case 111. In the cooling block 12a, the first coolant path section 19a, which is the first coolant path, is formed and the power semiconductor module 300 is inserted into the first coolant path. In the cooling block 12c, the third coolant path section 19c, which is the second coolant path, is formed in parallel to the first coolant path section 19a and the power semiconductor module 300 is inserted into the second coolant path. The DC/DC converter 100 includes the inductance devices (main transformer 33 and inductance devices 34) for voltage conversion, the boost circuit board 32, and the board (power semiconductor module 35). On the boost circuit board 32, the switching devices 36 are mounted to control the current flowing in the inductance devices. On the power semiconductor module 35, the switching devices H1 to H4 are mounted. The inductance devices and the switching device board are arranged in an area thermally contacting the cooling block 12a and the cooling block 12c of the case 111.

Thus, the case 111 is fixed so as to thermally contact the cooling blocks 12a and 12c in which the coolant path sections 19a and 19c are formed, and the heating components, such as the inductance devices 34 for voltage conversion, are arranged in the area thermally contacting the cooling blocks 12a and 12c of the case 111. With this configuration, the heating components of the DC/DC converter 100 can be efficiently cooled using the cooling system of the inverter 200. As a result, degradation of the functions and deterioration of the components in the device due to the high temperature environment may be prevented.

As described above, the inverter is the component for power-driving used in common in the HEV (hybrid electric vehicle), the PHEV (plug-in hybrid electric vehicle), or the EV, and generally used regardless of vehicle types. On the other hand, the DC/DC converter is mounted on the PHEV or the EV, and generally varied depending on the vehicle type. Also, the DC/DC converter needs to cope with different DC/DC capacity in accordance with an LV battery load. Therefore, generally in the prior technologies, the inverter and the DC/DC converter are separately arranged, and each of them includes its own cooling structure using the coolant. As a result, the cooling structures are formed of two separate circuits, in which conveyance loss is increased. Also, this has been the obstructive factor in reducing the size/weight and the cost.

In contrast, according to the present embodiment, the size of the power converter 1 may be reduced because the inverter 200 and the DC/DC converter 100 are detachably integrated, eliminating the cooling system of the DC/DC converter 100. Further, in the case bottom portion 111*b* of the case 111, not only the area thermally contacting the cooling blocks 12*a* and 12*c* of the inverter 200 but also other areas therebetween may be used as the cooling surfaces, thereby allowing more components to be cooled. Additionally, since the inverter 200 and the DC/DC converter 100 are detachably integrated, no design change is required for the configuration and the circuit, including the design of the inverter, even in the case where the DC/DC converter 100 is varied depending on the vehicle type. That is, a change may be made independently in accordance with the DC/DC capacity.

Meanwhile, the coolant path section 19*a* and the coolant path section 19*c* are connected to the coolant path section 19*b* so that the coolant makes a U-turn inside the case 10. However, it is also possible to form an outlet of the coolant path section 19*a* and an mien of the coolant path section 19*c* on the sidewall 10*b*, and connect the coolant paths 19*a* and 19*b* with a pipe and the like outside the case 10.

(2) Particularly, the inductance devices 34 for voltage conversion having a relatively high heat value are arranged in an area of the case 111 thermally contacting the cooling block 12*a* on the upstream side of the coolant flow, and the switching device board is arranged in an area of the case 111 thermally contacting the cooling block 12*c* on the downstream side of the coolant flow. As a result, a plurality of the heating components having different heat values may be efficiently cooled respectively.

(3) The case 10 includes the cooling block 12*b*, in which the coolant path 19*b* connecting the coolant path 19*a* to the coolant path 19*c* is formed. The cooling block 12*b* thermally contacts the case 111. The DC/DC converter 100 includes the down converter circuit and the boost converter circuit. The inductance devices (main transformer 33, inductance devices 34) may be arranged in the area of the case 111 thermally contacting the cooling block 12*a*. The board (power semiconductor module 35), on which the switching devices H1 to H4 of the down converter circuit are mounted, may be arranged in the area of the case 111 thermally contacting either the cooling block 12*c* or the cooling block 12*b*. Also, the boost circuit board 32, on which the switching devices of the boost converter circuit are mounted, may be arranged in the area of the case 111 thermally contacting the other one of the cooling block 12*c* and the cooling block 12*b*. By thus arranging the cooling blocks 12*a* to 12*c*, more heating components may be arranged on the case bottom portion 111*b* facing the coolant paths.

Meanwhile, according to the above-described embodiment, the power semiconductor module 35 is arranged in the area of the case 111 contacting the cooling block 12*b* as illustrated in FIG. 11. However, the power semiconductor module 35 may be arranged in the area contacting the cooling block 12*c* as well.

(4) The cooling blocks 12*a* and 12*c* and the cooling block 12*b* may respectively include the projected portions 406 and 407 projecting in the direction of the facing case 111. On the surface of the case 111 facing the case 10, the depressed portion 111*d* may be formed in the area facing at least the projected portions 406 and 407 so that the projected portions 406 and 407 may thermally contact the depressed portion 111*d* to be fitted to the depressed portion 111*d*. As a result, a heat contact area between the case 10 and the case 111 becomes larger, thereby improving cooling effect on the case 111 side. Moreover, a structure which requires a large thickness is arranged in an area having a large thickness other than the depressed portion 111*d*. As a result, a height of lamination may be shortened when fixing the case 10 to the case 111 in a laminating manner. Also, the power converter 1 may be downsized. Further, when in the cases, the projected portion is fitted to depressed portion. Thus, the assembling work is simple.

(5) The thermal conductive grease or the heat dissipation sheet may be disposed in the space between the projected portion and the depressed portion, thereby improving heat transfer characteristics between the case 10 and the case 111. Meanwhile, in the examples illustrated in FIGS. 10 and 12, the heat dissipation sheet 120 is disposed all over the space between the case 10 and the case 111. However, the heat dissipation sheet does not have to be disposed all over the space. For example, the he dissipation sheet 120 may be disposed in a space of an area where a heating component is arranged.

(6) As illustrated in FIG. 13, the inclination angle θ2 of the side surface 10*f* of the projected portion 406 is set smaller than 90 degrees and the inclination angle θ1 of the side surface 111*f* of the depressed portion 111*d* is set smaller than 90 degrees. As a result, adhesiveness of the thermal conductive grease or the heat dissipation sheet may be improved, and clearance formed at the contact surfaces, which is the factor of hindering the heat transfer characteristics, may be prevented.

(7) Additionally, the inclination angle θ2 of the side surface 10*f* of the projected portion 406 is set larger than the inclination angle θ1 of the side surface 111*f* of the depressed portion 111*d*. As a result, an effect is given in which the heat dissipation sheet 120 is pushed down to the corner where the clearance tends to be formed, and clearance to be formed an the corner may be more efficiently prevented.

(8) Further, the base plate 37 may be supported, above the inductance devices 34 for voltage conversion and the boost circuit board 32, with the plurality of supporting portions 111*a* projected from the case bottom portion 111*b*, and the control circuit board 30 may be mounted on the base plate 37. With this configuration, radiant heat from the heating components may be shielded by the base plate 37, and further the heat generated from the control circuit board 30 may be released to the case bottom portion 111*b* via the base plate 37 and the supporting portions 111*a*.

The above description is only an example, and the present invention, is not limited to the contents thereof. Also, other embodiments which are conceivable within the scope of the technical thought of the present invention are included in the scope of the present invention. For instance, the above-described embodiment is an example of the power converter mounted on the vehicle such as the PHEV or the EV, but the present invention may be applied not only thereto but also to a power converter used in a vehicle such as a construction machine.

The disclosure of the following application, based on which this application claims priority, is incorporated herein by reference:

Japanese Patent Application No. 2011-164055 (filed Jul. 27, 2011)

The invention claimed is:
1. A power conveter comprising:
an inverter housed in an inverter case and provided with a plurality of power semiconductor modules configured to output alternate current; and a DC/DC converter housed in a converter case detachably fixed to the inverter case, and provided with a down converter circuit and/or a boost converter circuit, wherein the inverter case includes:
- a first path forming member in which a first coolant path is formed, the power semiconductor module being inserted into the first coolant path, and the first path forming member thermally contacting the converter case; and
- a second path forming member in which a second coolant path is formed parallel to the first coolant path, the power semiconductor module being inserted into the second coolant path, and the second path forming member thermally contacting the converter case, the DC/DC converter includes:
- an inductance device for voltage conversion; and
- a switching device board on which a switching device that controls current flowing in the inductance device is mounted, and the inductance device and the switching device board are arranged in an area of the converter case thermally contacting the first path forming member and the second path forming member.

2. The power converter according to claim 1, wherein coolant flows from the first coolant path to the second coolant path, the inductance device is arranged in an area thermally contacting the first path forming member, and the switching device board is arranged in an area thermally contacting the second path forming member.

3. The power converter according to claim 1, wherein the inverter case includes a third path forming member in which a third coolant path connecting the first coolant path to the second coolant path is formed, the third path forming member thermally contacting the converter case, the DC IDC converter includes:
- a down converter circuit; and
- a boost converter circuit, the inductance device is arranged in an area of the converter case thermally contacting the first path forming member, a board, on which the switching device of the down converter circuit is mounted, is arranged in an area of the converter case thermally contacting one of the second path forming member and the third path forming member, and a board, on which the switching device of the boost converter circuit is mounted, is arranged in an area of the converter case thermally contacting the other one of the second path forming member and the third path forming member.

4. The power converter according to claim 3, wherein the first path forming member, the second path forming member, and the third path forming member respectively include projected portions which project in a direction of the facing converter case, and the converter case includes a depressed portion formed on a surface facing the inverter case, at least in an area facing the projected portion, and the projected portion thermally contacts the depressed portion to fit into the depressed portion.

5. The power converter according to claim 4, wherein thermal conductive grease or a heat dissipation sheet is disposed in a space between the projected portion and the depressed portion.

6. The power converter according to claim 5, wherein a side surface of the projected portion and a side surface of the depressed portion, which thermally contact each other, are inclined at inclination angles smaller than 90 degrees, respectively.

7. The power converter according to claim 6, wherein the inclination angle of the side surface of the projected portion is larger than the inclination angle of the side surface of the depressed portion.

8. The power converter according to claim 1, comprising:

a plurality of supporting members formed on the converter case and supporting a metal plate above the inductance device and the switching device board; and a control circuit board mounted on the metal plate and configured to control driving of the switching device in the DC/DC converter.

* * * * *